(12) United States Patent
Lee

(10) Patent No.: US 7,432,144 B2
(45) Date of Patent: Oct. 7, 2008

(54) METHOD FOR FORMING A TRANSISTOR FOR REDUCING A CHANNEL LENGTH

(75) Inventor: Kye-Nam Lee, Sungnam (KR)

(73) Assignee: Dongbu Electronics Co., Ltd., Seoul (KR)

( * ) Notice: Subject to any disclaimer, the term of this patent is extended or adjusted under 35 U.S.C. 154(b) by 405 days.

(21) Appl. No.: 11/320,694

(22) Filed: Dec. 30, 2005

(65) Prior Publication Data
US 2006/0148146 A1    Jul. 6, 2006

(30) Foreign Application Priority Data
Dec. 30, 2004    (KR) .................. 10-2004-0117153

(51) Int. Cl.
H01L 21/337    (2006.01)
(52) U.S. Cl. ............... 438/181; 438/163; 438/154; 438/180; 438/229; 438/230; 438/231; 438/232; 438/585; 257/E21.433
(58) Field of Classification Search ........... 438/163, 438/154, 180–181, 229–232, 585; 257/E21.433
See application file for complete search history.

(56) References Cited

U.S. PATENT DOCUMENTS 5,688,703 A * 11/1997 Klingbeil et al. ........... 438/181
7,170,139 B2 * 1/2007 Pan ......................... 257/412
7,332,387 B2 * 2/2008 Chu ......................... 438/197

FOREIGN PATENT DOCUMENTS

KR    2003-0013624    2/2003

* cited by examiner

Primary Examiner—Michelle Estrada
Assistant Examiner—Jarrett J Stark
(74) Attorney, Agent, or Firm—Lowe Hauptman Ham & Berner LLP

(57) ABSTRACT

A method of forming a transistor including: forming a gate oxide layer pattern and gate polysilicon layer pattern on a silicon substrate; forming a low energy ion implantation region aligned with both sidewalls of the gate polysilicon layer pattern; forming an amorphous region at a lower part of both sidewalls of the gate polysilicon layer pattern; reducing a channel length by removing the amorphous region so as to form a notch at a lower part of both sidewalls of the gate polysilicon layer pattern; forming a gate spacer at both sidewalls of the gate polysilicon layer pattern; and forming a high energy ion implantation region by high energy ion implantation of source/drain impurities into an entire surface of the silicon substrate including the gate polysilicon layer pattern and gate spacer.

6 Claims, 7 Drawing Sheets

US 7,432,144 B2

METHOD FOR FORMING A TRANSISTOR FOR REDUCING A CHANNEL LENGTH

CROSS-REFERENCE TO RELATED APPLICATION

This application claims priority to and the benefit of Korean Patent Application No. 10-2004-0117153 filed in the Korean Intellectual Property Office on Dec. 30, 2004, the entire contents of which are incorporated herein by reference.

BACKGROUND OF THE INVENTION (a) Field of the Invention

The present invention relates to a method for forming a transistor, and more particularly, to a method for forming a transistor with a reduced channel length.

(b) Description of the Related Art

Generally, a transistor is formed with a gate oxide layer and a gate polysilicon layer which are sequentially accumulated thereon. Typically, a source/drain region is formed at both sidewalls of the gate polysilicon layer. Hereinafter, a conventional method of forming a transistor will be described.

FIG. 1 to FIG. 3 are cross-sectional views showing a conventional method for forming a transistor.

Referring to FIG. 1 and FIG. 2, a gate oxide layer 12 and a gate polysilicon layer 14 are formed on a silicon substrate 10. A gate polysilicon layer pattern 14a is formed by patterning the gate polysilicon layer 14. A gate oxide layer pattern 12a is formed by patterning the gate oxide layer 12. Subsequently, a low energy ion implantation region 16 is formed to be aligned with both sides of the gate polysilicon layer pattern 14a. A halo ion implantation region 18 is formed below the low energy ion implantation region 16.

Referring to FIG. 3, a gate spacer 21 is formed at both sidewalls of the gate polysilicon layer pattern 14a. Subsequently, a high energy ion implantation region 22 is formed by high energy ion implantation of source/drain impurities into an entire surface of the silicon substrate including the gate polysilicon layer pattern 14a and gate spacer 21. Consequently, a source/drain region is composed of the low energy ion implantation region 16, pocket ion implantation region 18, and high energy ion implantation region 22.

However, according to a conventional method for forming a transistor, chlorine based gases, such as $Cl_2$, $BCl_3$, etc., are used in etching a gate polysilicon layer so as to prevent damage on lateral sides of the gate polysilicon layer.

Accordingly, as shown in FIG. 2, a polymer 20 is formed more thickly in a lower part of the gate polysilicon layer pattern 14a than in an upper part thereof. Consequently, as shown in FIG. 3, the gate polysilicon layer pattern 14a has a positive etch profile 24. Such a positive etch profile increases an effective channel length.

In addition, when fluorine based gases, such as $SF_6$, $CF_4$, $C_2F_8$, $CHF_3$, etc., are used for an isotropic etching process to prevent a channel length increase, it is possible to induce other problems, such as a decrease of a pattern size or deterioration of a pattern opening in a place where the height difference is great.

The above information disclosed in this Background section is only for enhancement of understanding of the background of the invention and therefore it may contain information that does not form prior art already known in this country to a person of ordinary skill in the art.

SUMMARY OF THE INVENTION

The present invention has been made in an effort to provide a method of forming a transistor with a reduced channel length.

An exemplary method of forming a transistor according to an embodiment of the present invention includes: forming a gate oxide layer pattern and a gate polysilicon layer pattern on a silicon substrate; forming a low energy ion implantation region aligned with both sidewalls of the gate polysilicon layer pattern; forming an amorphous region at a lower part of both sidewalls of the gate polysilicon layer pattern; reducing a channel length by removing the amorphous region so as to form a notch at a lower part of both sidewalls of the gate polysilicon layer pattern; forming a gate spacer at both sidewalls of the gate polysilicon layer pattern; and forming a high energy ion implantation region by high energy ion implantation of source/drain impurities into an entire surface of the silicon substrate including the gate polysilicon layer pattern and gate spacer.

As described above, since an effective channel length may be reduced by forming a notch at a lower sidewall of a gate polysilicon layer pattern, a margin for a short channel effect may be improved.

It is to be understood that both the foregoing general description of the invention and the following detailed description are exemplary, but are not restrictive of the invention.

BRIEF DESCRIPTION OF THE DRAWINGS

These and other aspects of the present invention will become evident by reference to the following description of the invention, often referring to the accompanying drawings.

DETAILED DESCRIPTION OF THE EMBODIMENTS

An exemplary embodiment of the present invention will hereinafter be described in detail with reference to the accompanying drawings.

FIG. 4 to FIG. 7 are cross-sectional views showing a method of forming a transistor according to an exemplary embodiment of the present invention.

Figure 1:
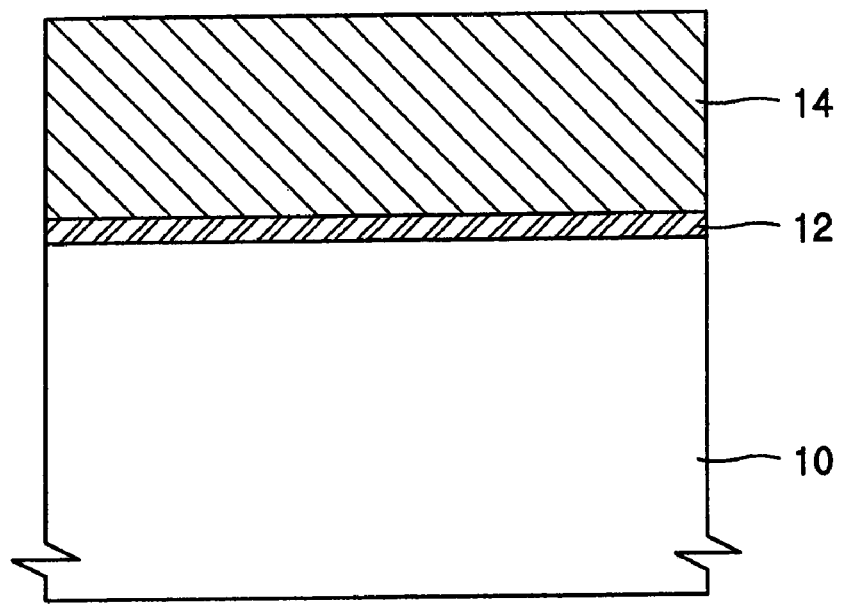
FIG. 1 to FIG. 3 are cross-sectional views showing a conventional method for forming a transistor.
Figure 2:
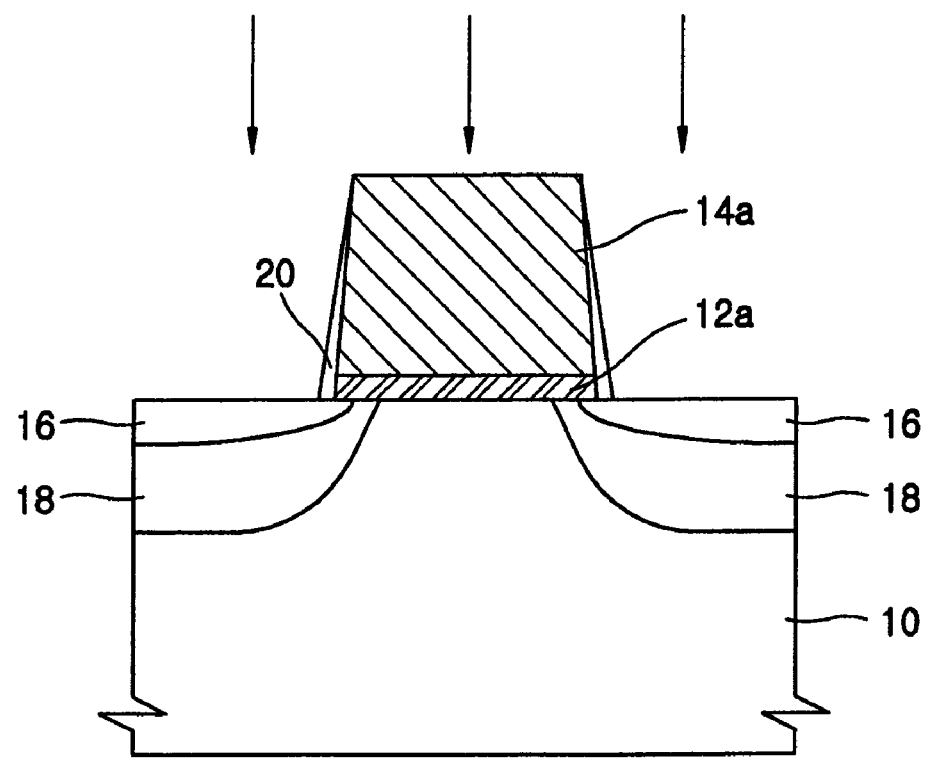
Figure 3:
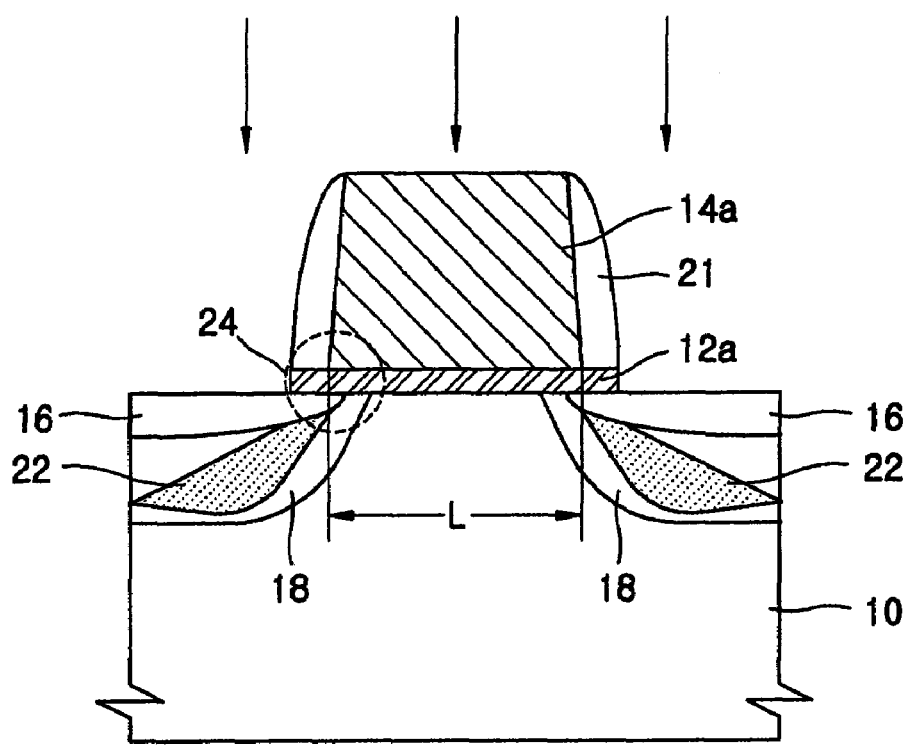
Figure 4:
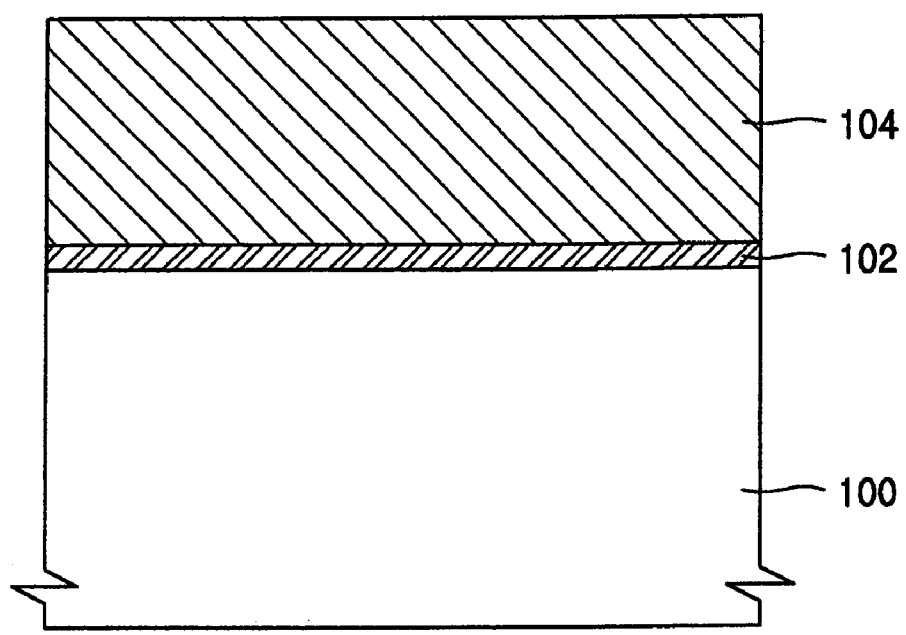
FIG. 4 to FIG. 7 are cross-sectional views showing a method for forming a transistor according to an exemplary embodiment of the present invention.
Figure 5:
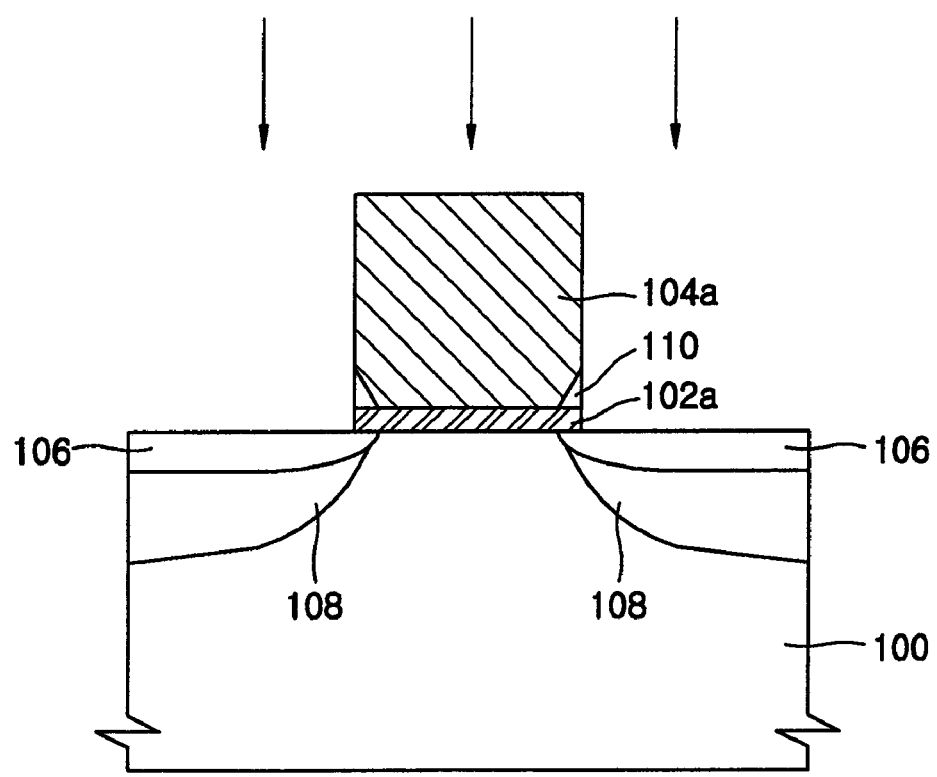

Referring to FIG. 4 and FIG. 5, a gate oxide layer 102 and gate polysilicon layer 104 are formed on a silicon substrate 100. A gate oxide layer pattern 102a and gate polysilicon layer pattern 104a are formed by patterning the gate oxide layer 102 and gate polysilicon layer 104.

Subsequently, a low energy ion implantation region 106 is formed to be aligned with both sides of the gate polysilicon layer pattern 104a, and a pocket ion implantation region 108 is formed below the low energy ion implantation region 106. The low energy ion implantation region 106 is formed by implanting impurities with 5 KeV or less.

The pocket ion implantation region 108 is formed so as to decrease an effective channel length. In forming the pocket ion implantation region 108, an amorphous region 110 is formed while removing a polymer remaining at a lower sidewall of the gate polysilicon-layer pattern 104a. The amorphous region 110 is a region that is damaged when forming the pocket ion implantation region 108.

Figure 6:
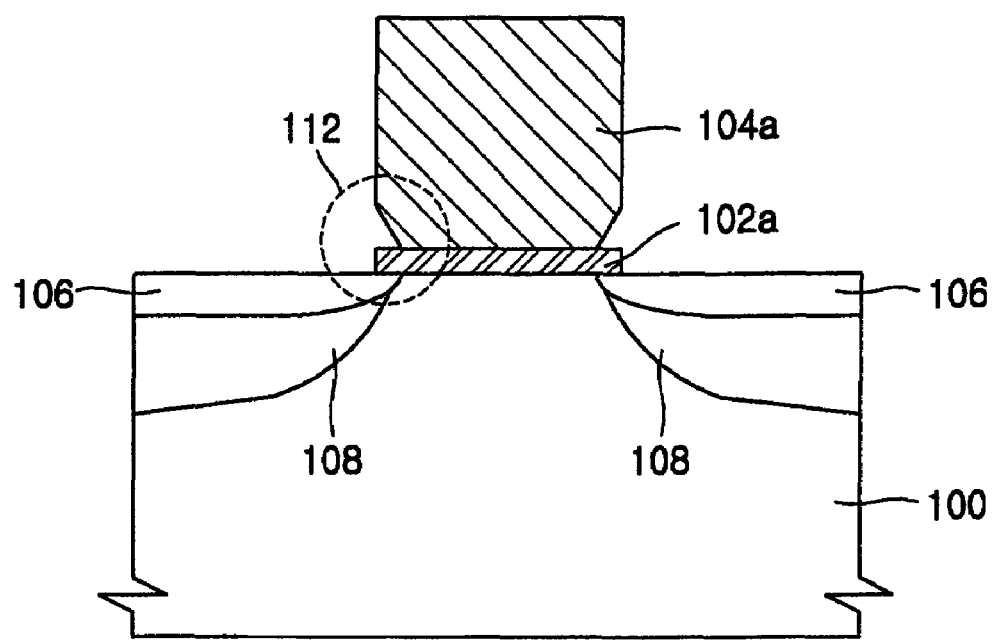

Referring to FIG. 6, the amorphous region 110 is removed by performing a wet cleaning process. That is, the amorphous region 110 is removed by etching with the use of a buffered oxide etch (BOE) solution. A notch 112 is formed at the lower sidewall of the gate polysilicon layer pattern 104a by removing the amorphous region 110.

Consequently, an effective channel length is shortened.

Figure 7:
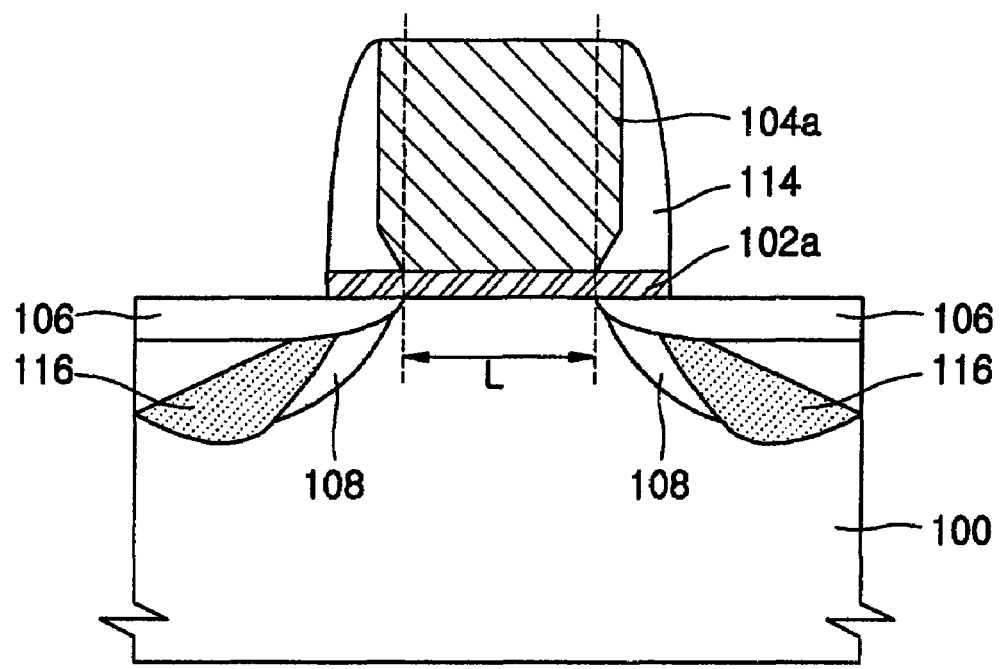

Referring to FIG. 7, a gate spacer 114 is formed at both sidewalls of the gate polysilicon layer pattern 104a. The gate spacer 114 is formed so as to improve a hot carrier margin.

Subsequently, a high energy ion implantation region 116 is formed by high energy ion implantation of source/drain impurities into the entire surface of the silicon substrate 100 including the gate polysilicon layer pattern 104a and the gate spacer 114.

The high energy ion implantation region 116 is formed by implanting impurities with 15 KeV or more. Consequently, a source/drain region is composed of the low energy ion implantation region 106, pocket ion implantation region 108, and high energy ion implantation region 116.

As described above, an effective channel length is reduced by forming a notch at a lower sidewall of a gate polysilicon layer pattern. Therefore, a margin for a short channel effect may be improved.

In addition, reduction of an effective channel length may ensure an effect of a current increase and a high-speed characteristic required for an analog pattern, such as a logic device.

In addition, reduction of an effective channel length may solve a problem that a leakage current is increased in an edge part of a gate polysilicon layer pattern.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for forming a transistor, comprising:
    forming a gate oxide layer pattern and gate polysilicon layer pattern on a silicon substrate;
    forming a low energy ion implantation region aligned with both sidewalls of the gate polysilicon layer pattern;
    forming an amorphous region at a lower part of both sidewalls of the gate polysilicon layer pattern;
    reducing a channel length by removing the amorphous region so as to form a notch at a lower part of both sidewalls of the gate polysilicon layer pattern;
    forming a gate spacer at both sidewalls of the gate polysilicon layer pattern; and
    forming a high energy ion implantation region by high energy ion implantation of source/drain impurities into an entire surface of the silicon substrate including the gate polysilicon layer pattern and gate spacer.

2. The method of claim 1, wherein the forming of the gate oxide layer pattern and gate polysilicon layer pattern comprises:
    forming a gate oxide layer and gate polysilicon layer on the silicon substrate; and
    patterning the gate oxide layer and gate polysilicon layer.

3. The method of claim 1, wherein the forming an amorphous region includes forming the amorphous region together while forming a pocket ion implantation region below the low energy ion implantation region.

4. An apparatus for forming a transistor, comprising:
    means for forming a gate oxide layer pattern and gate polysilicon layer pattern on a silicon substrate;
    means for forming a low energy ion implantation region aligned with both sidewalls of the gate polysilicon layer pattern;
    means for forming an amorphous region at a lower part of both sidewalls of the gate polysilicon layer pattern;
    means for reducing a channel length by removing the amorphous region so as to form a notch at a lower part of both sidewalls of the gate polysilicon layer pattern;
    means for forming a gate spacer at both sidewalls of the gate polysilicon layer pattern; and
    means for forming a high energy ion implantation region by high energy ion implantation of source/drain impurities into an entire surface of the silicon substrate including the gate polysilicon layer pattern and gate spacer.

5. The apparatus of claim 4, wherein the means for forming of the gate oxide layer pattern and gate polysilicon layer pattern comprises:
    means for forming a gate oxide layer and gate polysilicon layer on the silicon substrate; and
    means for patterning the gate oxide layer and gate polysilicon layer.

6. The apparatus of claim 4, wherein means for the forming an amorphous region includes means for forming the amorphous region together while forming a pocket ion implantation region below the low energy ion implantation region.

* * * * *